(12) United States Patent
Yin et al.

(10) Patent No.: US 12,192,664 B2
(45) Date of Patent: Jan. 7, 2025

(54) IMAGE SENSOR AND OPERATION METHOD THEREOF

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Yu-Hsiang Wang, Hsinchu (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 141 days.

(21) Appl. No.: 18/303,586

(22) Filed: Apr. 20, 2023

(65) Prior Publication Data

US 2023/0370750 A1 Nov. 16, 2023

Related U.S. Application Data

(60) Provisional application No. 63/341,423, filed on May 13, 2022.

(51) Int. Cl.
*H04N 25/78* (2023.01)
*G06F 1/08* (2006.01)
(Continued)

(52) U.S. Cl.
CPC ............... *H04N 25/78* (2023.01); *G06F 1/08* (2013.01); *H01L 25/0753* (2013.01); *H01L 25/18* (2013.01); *H01L 27/14612* (2013.01); *H01L 27/14632* (2013.01); *H01L 27/14636* (2013.01); *H03K 19/018521* (2013.01); *H03L 7/099* (2013.01); *H04N 25/60* (2023.01); *H04N 25/627* (2023.01); *H04N 25/63* (2023.01);
(Continued)

(58) Field of Classification Search
CPC ...... H04N 25/618; H04N 25/65; H04N 25/67; H04N 25/709; H04N 25/77; H04N 25/778; H04N 25/78
See application file for complete search history.

(56) References Cited

U.S. PATENT DOCUMENTS

| 2005/0151060 A1* | 7/2005 | Hashiguchi | ............ H04N 3/155 348/E3.018 |
| 2006/0192870 A1* | 8/2006 | Shoho | .................. H04N 25/778 348/E3.018 |

(Continued)

OTHER PUBLICATIONS

"Office Action of Taiwan Counterpart Application", issued on Sep. 5, 2023, pp. 1-6.

*Primary Examiner* — Daniel M Pasiewicz
(74) *Attorney, Agent, or Firm* — JCIPRNET

(57) ABSTRACT

An image sensor and an operating method thereof are provided. The image sensor includes a first pixel circuit, a first column readout circuit, and a second column readout circuit. The first pixel circuit includes a first pixel unit, a first transfer transistor, a first reset transistor, a first readout transistor, and a first capacitor. The first column readout circuit includes a first circuit node. The second column readout circuit includes a bias transistor. A first terminal of the first reset transistor and a first terminal of the first readout transistor are coupled to the first circuit node, and a second terminal of the first readout transistor is coupled to the bias transistor.

16 Claims, 8 Drawing Sheets

(51) Int. Cl.
  *H01L 25/075* (2006.01)
  *H01L 25/18* (2023.01)
  *H01L 27/146* (2006.01)
  *H03K 19/0185* (2006.01)
  *H03L 7/099* (2006.01)
  *H04N 25/60* (2023.01)
  *H04N 25/627* (2023.01)
  *H04N 25/63* (2023.01)
  *H04N 25/709* (2023.01)
  *H04N 25/76* (2023.01)
  *H04N 25/77* (2023.01)
  *H04N 25/772* (2023.01)
  *H04N 25/778* (2023.01)

(52) U.S. Cl.
  CPC ........... *H04N 25/709* (2023.01); *H04N 25/77* (2023.01); *H04N 25/772* (2023.01); *H04N 25/778* (2023.01); *H04N 25/7795* (2023.01)

(56) References Cited

U.S. PATENT DOCUMENTS

| | | |
|---|---|---|
| 2015/0009379 A1 | 1/2015 | Yan et al. |
| 2018/0352183 A1 | 12/2018 | Mn |
| 2021/0203869 A1 | 7/2021 | Ma et al. |
| 2022/0014702 A1* | 1/2022 | Yin ..................... H04N 25/707 |

* cited by examiner

IMAGE SENSOR AND OPERATION METHOD THEREOF

CROSS-REFERENCE TO RELATED APPLICATION

This application claims the priority benefit of the U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensor, and particularly relates to an image sensor and an operation method thereof.

Description of Related Art

Generally, a plurality of selection transistors, a plurality of selection signal lines, a plurality of bias signal lines and a plurality of reset signal lines must be provided in a conventional image sensor to respectively provide bias voltages and reset voltages. Moreover, from a point of view of a manufacturing process, the selection transistors occupy a circuit space of a pixel array of the image sensor, and the selection signal lines, the bias signal lines and the reset signal lines will span across the pixel array of the image sensor, which leads to a decrease in a fill factor of the image sensor and poor Gb/Gr balance.

SUMMARY

The disclosure is directed to an image sensor and an operation method thereof, where the image sensor has a higher fill factor and has a good Gb/Gr balance effect.

The disclosure provides an image sensor including a first pixel circuit, a first column readout circuit, and a second column readout circuit. The first pixel circuit includes a first pixel unit, a first transfer transistor, a first reset transistor, a first readout transistor, and a first capacitor. The first column readout circuit includes a first circuit node. The second column readout circuit includes a bias transistor. A first terminal of the first transfer transistor is coupled to a first floating diffusion node. A second terminal of the first transfer transistor is coupled to the first pixel unit. The first reset transistor is coupled to the first floating diffusion node. A control terminal of the first readout transistor is coupled to the first floating diffusion node. The first capacitor is coupled between a ramp signal and the floating diffusion node. A first terminal of the first reset transistor and a first terminal of the first readout transistor are coupled to the first circuit node, and a second terminal of the first readout transistor is coupled to the bias transistor.

The disclosure provides an operation method adapted to an image sensor. The image sensor includes a first pixel circuit, a first column readout circuit, and a second column readout circuit. The first pixel circuit includes a first pixel unit, a first transfer transistor, a first reset transistor, a first readout transistor, and a first capacitor. The first column readout circuit includes a first circuit node. The second column readout circuit includes a bias transistor. A first terminal of the first reset transistor and a first terminal of the first readout transistor are coupled to the first circuit node, and a second terminal of the first readout transistor is coupled to the bias transistor. The operation method includes following steps: during a reset period, a first reset signal is received through a control terminal of the first reset transistor, and a transfer signal is first received through a control terminal of the transfer transistor to reset voltages of a first sampling node and a first floating diffusion node, and then the transfer transistor is turned off, and a pull-down control signal is received through a control terminal of a second transistor (pull-down transistor), so as to pull down the voltage of the first floating diffusion node. During a readout period, a first reset signal is first received through the control terminal of the first reset transistor to reset the voltage of the first floating diffusion node, and then the transfer signal is received through the control terminal of the transfer transistor, so as to turn on the first readout transistor, and a charge accumulated at the first pixel unit is transferred to the first floating diffusion node to change the voltage of the first floating diffusion node, and the voltage of the first floating diffusion node generates a readout signal from the first circuit node through the first readout transistor. During a pull-down period, the first reset signal is received through the control terminal of the first reset transistor, and the pull-down control signal is received through a control terminal of the second transistor to pull down the voltage of the first floating diffusion node.

Based on the above description, in the image sensor and the operation method thereof of the disclosure, by integrating signal lines for providing the reset voltage and the bias voltage into usage of a same circuit node of the column readout circuit; and by adding a pull-down transistor in the column readout circuit, the function of pixel selection may be realized, and at least the selection transistor and metal wiring for providing the reset voltage are unnecessary to be set, so that the image sensor has a good fill factor, and better Gb/Gr balance effect.

To make the aforementioned more comprehensible, several embodiments accompanied with drawings are described in detail as follows.

DESCRIPTION OF THE EMBODIMENTS

Figure 1:
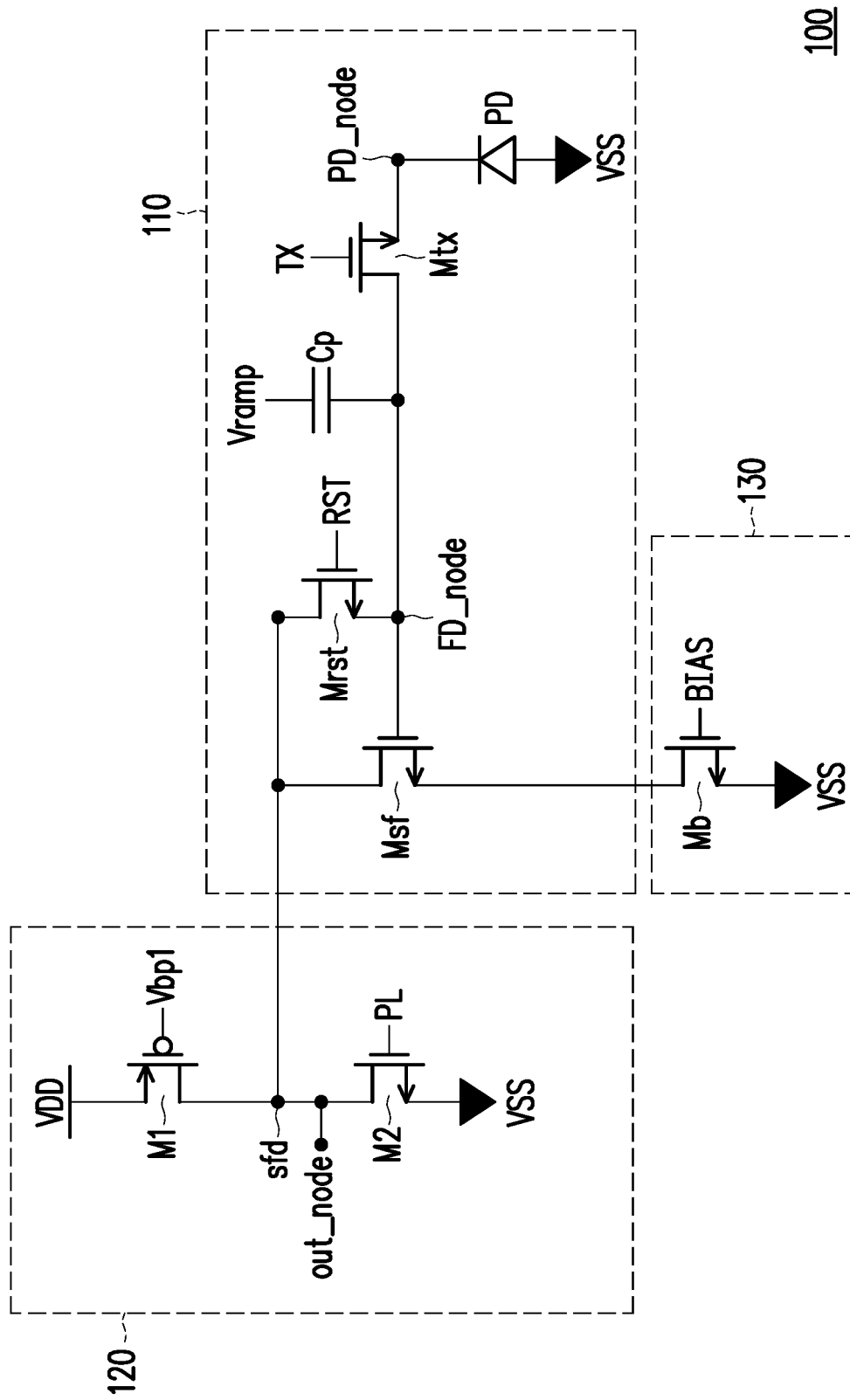
FIG. 1 is a schematic circuit diagram of an image sensor according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic circuit diagram of an image sensor according to an embodiment of the disclosure. Referring to FIG. 1, an image sensor 100 includes a pixel circuit 110, a first column readout circuit 120 and a second r column readout circuit 130. The pixel circuit 110 includes a pixel unit PD, a transfer transistor Mtx, a reset transistor Mrst, a readout transistor Msf, and a capacitor Cp. The first column readout circuit 120 includes a circuit node sfd, a first transistor M1 and a second transistor M2. The second column readout circuit 130 includes a bias transistor Mb. The pixel circuit 110 may be an internal circuit of a pixel disposed in a pixel array of the image sensor 100 and disposed in an active area (AA) of the image sensor 100. The first column readout circuit 120 and the second column readout circuit 130 may be disposed in a peripheral area of the image sensor 100.

In the embodiment, the pixel unit PD may be a photodiode. The transfer transistor Mtx, the reset transistor Mrst, the readout transistor Msf, the second transistor M2 and the bias transistor Mb may be respectively N-type transistors (such as N-type metal oxide semiconductor (NMOS)). The first transistor M1 may be a P-type transistor. First terminals of the transfer transistor Mtx, the reset transistor Mrst, the readout transistor Msf, the second transistor M2 and the bias transistor Mb may be respectively drain terminals of the transistors. A first terminal of the first transistor M1 may be a source terminal of the transistor. Second terminals of the transfer transistor Mtx, the reset transistor Mrst, the readout transistor Msf, the second transistor M2, and the bias transistor Mb may be respectively source terminals of the transistors. A second terminal of the first transistor M1 may be a drain terminal of the transistor. Control terminals of the transfer transistor Mtx, the reset transistor Mrst, the readout transistor Msf, the first transistor M1, the second transistor M2 and the bias transistor Mb may be respectively gate terminals of the transistors.

In the embodiment, the first terminal of the transfer transistor Mtx is coupled to a floating diffusion node FD_node. The second terminal of the transfer transistor Mtx is coupled to a first terminal of the pixel unit PD (such as a cathode of the photodiode). The control terminal of the transmit transistor Mtx receives a transfer signal TX. A second terminal of the pixel unit PD (for example, an anode of the photodiode) is coupled to a second operating voltage VSS. The first terminal of the reset transistor Mrst is coupled to the circuit node sfd of the first column readout circuit 120. The circuit node sfd is coupled to an output node out_node. The second terminal of the reset transistor Mrst is coupled to the floating diffusion node FD_node. The control terminal of the reset transistor Mrst receives a reset signal RST. The first terminal of the readout transistor Msf is coupled to the circuit node sfd of the first column readout circuit 120. The second terminal of the readout transistor Msf is coupled to the first terminal of the bias transistor Mb of the second column readout circuit 130. The control terminal of the readout transistor Msf is coupled to the floating diffusion node FD_node. The capacitor Cp is coupled between a ramp signal Vramp and the floating diffusion node FD_node. A first terminal of the capacitor Cp receives the ramp signal Vramp. A second terminal of the capacitor Cp is coupled to the floating diffusion node FD_node. In the embodiment, the ramp signal Vramp may be an up ramp signal or a down ramp signal.

In the embodiment, the first terminal of the first transistor M1 is coupled to a first operating voltage VDD. The second terminal of the first transistor M1 is coupled to the circuit node sfd. The control terminal of the first transistor M1 is coupled to a control voltage Vbp1. The first terminal of the second transistor (pull-down transistor) M2 is coupled to the circuit node sfd. The second terminal of the pull-down transistor M2 is coupled to the second operating voltage VSS. The control terminal of the second transistor M2 receives a pull-down control signal PL. In the embodiment, the second terminal of the bias transistor Mb is coupled to the second operating voltage VSS. The control terminal of the bias transistor Mb receives a bias signal BIAS. In the embodiment, the circuit node sfd may selectively apply a bias voltage or the second operating voltage (VSS) to the readout transistor Msf and the reset transistor Mrst according to a change of the pull-down control signal PL.

In the embodiment, the first column readout circuit 120 may provide a reset voltage to the floating diffusion node FD_node through the circuit node sfd according to the pull-down control signal PL and the control voltage Vbp1, so as to reset a voltage of the floating diffusion node FD_node. Moreover, the first column readout circuit 120 may also provide the bias voltage to the first terminal of the readout transistor Msf through the circuit node sfd according to the pull-down control signal PL and the control voltage Vbp1, so as to read the voltage of the floating diffusion node FD_node from the output node out_node. The voltage provided by the circuit node sfd is determined by the pull-down control signal PL and the control voltage Vbp1 by controlling the first transistor M1 and the second transistor M2.

In the embodiment, since both of the bias voltage and the reset voltage required by the pixel circuit 110 are provided by the circuit node sfd, the bias voltage and the reset voltage required by the pixel circuit 110 may be obtained through the column readout circuit 120 through a same wiring. Moreover, the pixel circuit 110 may not be provided with a selection transistor and a selection signal line. In other words, the pixel array of the image sensor 100 may effectively save a plurality of metal wires (for example, respectively used for providing reset voltages and selection signals for multiple columns or rows of pixel circuits) in a vertical direction or a horizontal direction in the active area and the selection transistor. In this way, the image sensor 100 of the embodiment may have a higher fill factor and may have a good Gb/Gr balance effect.

In the embodiment, the image sensor 100 may be a CMOS image sensor (CIS), and may be an active pixel sensor (APS). The image sensor 100 may be implemented by a back side illuminated (BSI) or front side illuminated (FSI) manufacturing process and package structure. The feature of high fill factor makes this structure especially suitable for small pitch pixels to further improve circuit performance.

Figure 2:
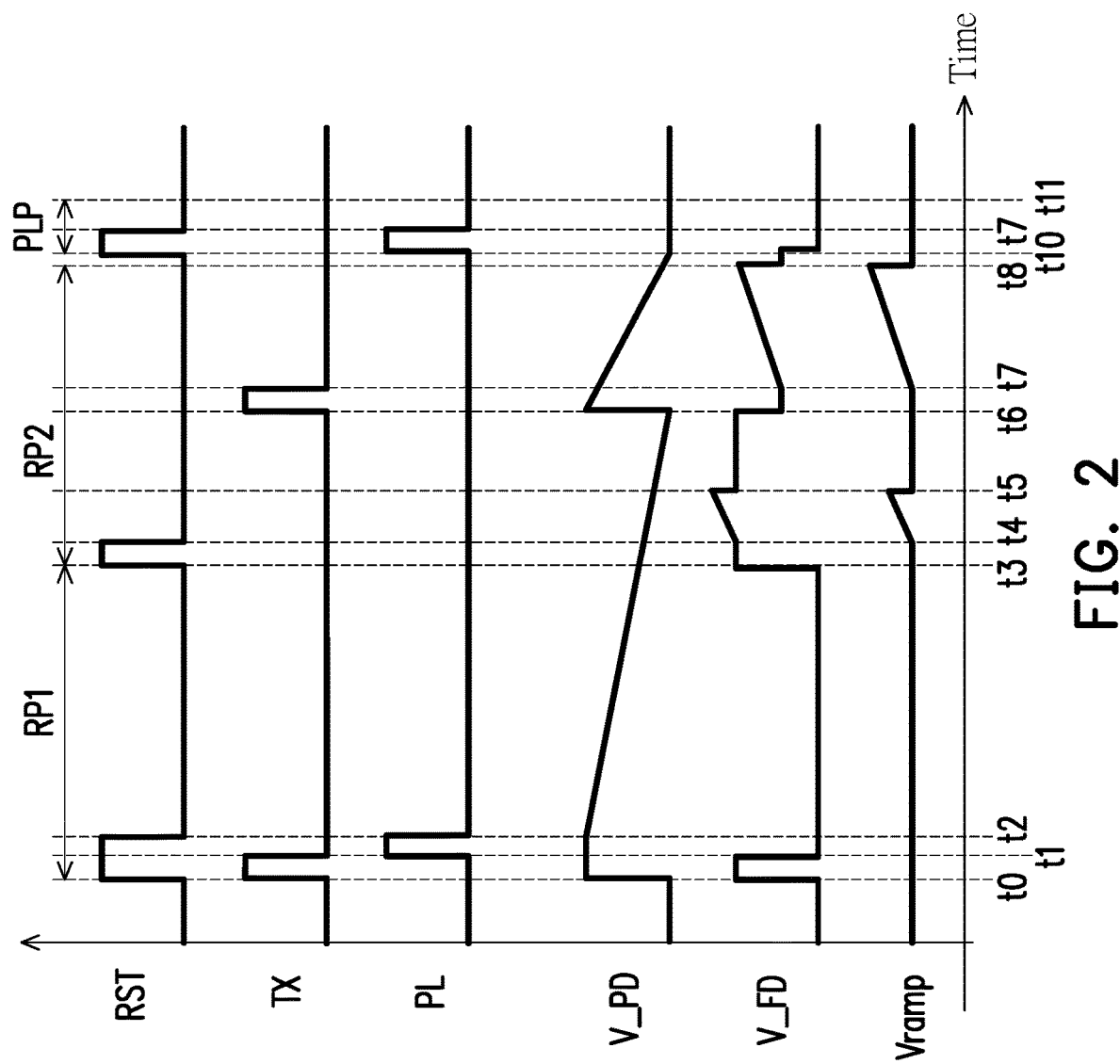
FIG. 2 is an operation timing diagram of the image sensor of the embodiment of FIG. 1.

FIG. 2 is an operation timing diagram of the image sensor of the embodiment of FIG. 1. Referring to FIG. 1 and FIG. 2, the image sensor 100 may operate in the operation timing shown in FIG. 2. During a period from a time t0 to a time t3, the image sensor 100 may operate in a reset period RP1. During a period from the time t0 to a time t2, the reset signal RST is switched from a low voltage level to a high voltage level to turn on the reset transistor Mrst. During a period from the time t0 to a time t1, the pull-down control signal PL is at a low voltage level, and the transfer signal TX is switched from the low voltage level to the high voltage level to turn on the transfer transistor Mtx. In this way, a voltage V_FD of the floating diffusion node FD_node and a voltage V_PD of a sampling node PD_node may be respectively reset by a voltage of the circuit node sfd (for example, the first operating voltage VDD). During a period from the time t1 to the time t2, the pull-down control signal PL is switched from the low voltage level to the high voltage level, and the transfer signal TX is switched to the low voltage level to pull down (reset) the voltage of the circuit node sfd and the voltage V_FD of the sampling node FD_node. During a period from the time t2 to a time t6, the pixel unit PD is exposed to decrease the voltage V_PD of the sampling node PD_node.

During a period from the time t3 to a time t8, the image sensor 100 may operate in a readout period RP2. During a period from the time t3 to a time t4, the reset signal RST is switched from the low voltage level to the high voltage level to turn on the reset transistor Mrst. In this way, the voltage V_FD of the floating diffusion node FD_node is reset to the high voltage level by the voltage of the circuit node sfd (for example, the first operating voltage VDD). During a period from the time t4 to a time t5, a voltage of the ramp signal Vramp forms an up-ramp waveform, so that the voltage V_FD of the floating diffusion node FD_node forms the up-ramp waveform correspondingly. In this way, the readout transistor Msf may read the voltage V_FD of the floating diffusion node FD_node (i.e., a background noise signal) to the circuit node sfd during the period from the time t4 to the time t5. During a period from the time t6 to a time t7, the transfer signal TX is switched from the low voltage level to the high voltage level to turn on the transfer transistor Mtx, so as to transfer the voltage V_PD of the sampling node PD_node (i.e., a sensing result (sensing signal) of the pixel unit PD) to the floating diffusion node FD_node, and the voltage V_PD of the sampling node PD_node recovers to the high voltage level. During a period from the time t6 to a time t9, the voltage V_PD of the sampling node PD_node drops due to the exposure of the pixel unit PD. During a period from the time t7 to the time t8, the voltage of the ramp signal Vramp forms another up-ramp waveform, so that the voltage V_FD of the floating diffusion node FD_node forms another up-ramp waveform correspondingly. In this way, the readout transistor Msf may read the voltage V_FD of the floating diffusion node FD_node (i.e., the sensing result (sensing signal) of the pixel unit PD) to the circuit node sfd during the period from the time t7 to the time t8.

During a period from the time t9 to a time t11, the image sensor 100 may operate in a pull-down period PLP. During a period from the time t9 to a time t10, the reset signal RST and the pull-down signal PL are respectively switched from the low voltage level to the high voltage level to turn on the reset transistor Mrst and the second transistor. In this way, the readout transistor Msf serving as a source follower may be turned off. Therefore, other computing circuits of the first column readout circuit 120 may perform denoising processing on the sensing signal according to the background noise signal, so as to generate a sensing signal without background noise (i.e., to obtain a sensing signal with a higher signal-to-noise ratio (SNR)).

Figure 3:
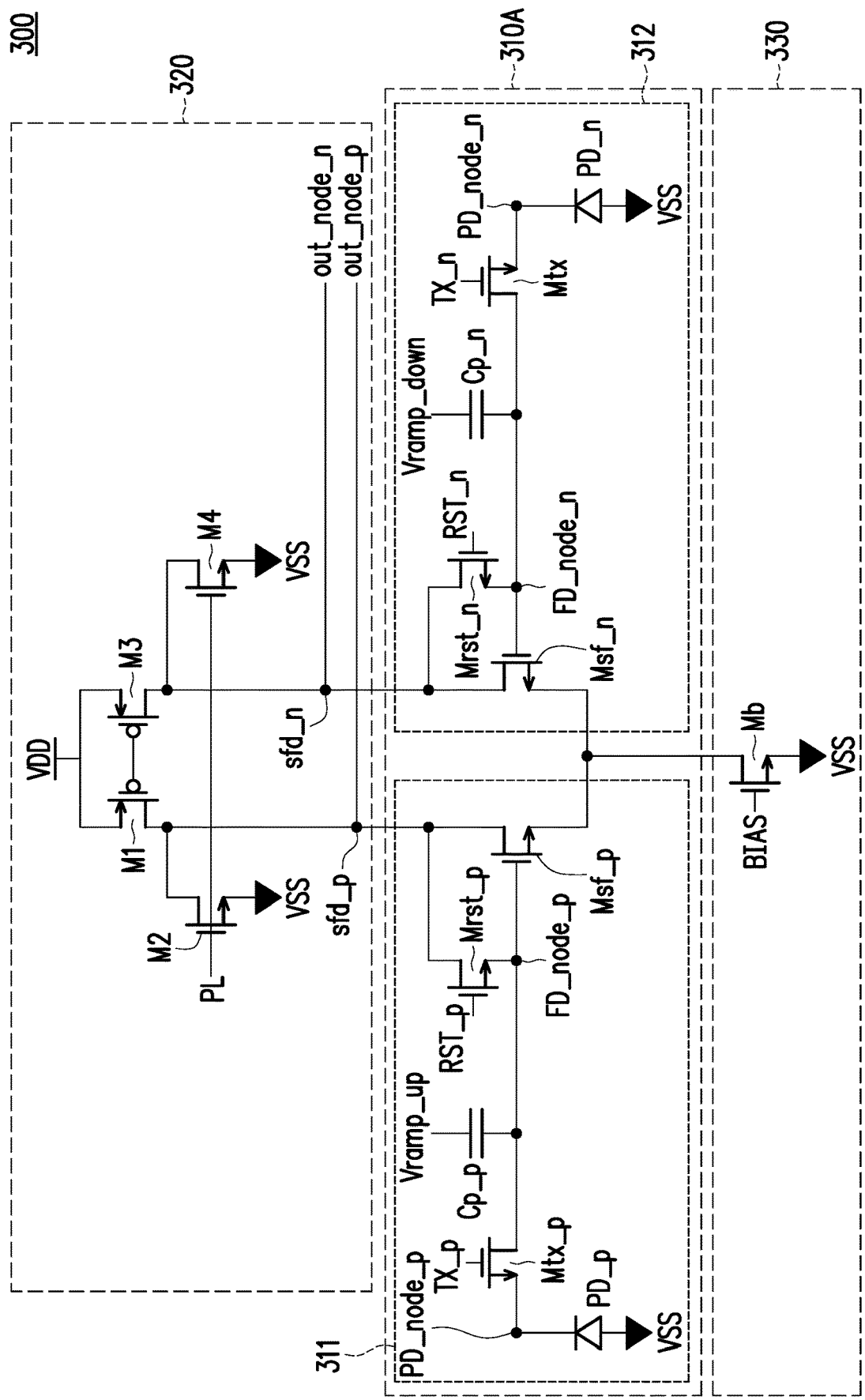
FIG. 3 is a schematic circuit diagram of an image sensor according to another embodiment of the disclosure.

FIG. 3 is a schematic circuit diagram of an image sensor according to another embodiment of the disclosure. Referring to FIG. 3, an image sensor 300 may be implemented as a correlated double sampling (CDS) circuit or a double correlated double sampling (DDS) circuit. In the embodiment, a pixel array 310A of the image sensor 300 includes a first pixel circuit 311 and a second pixel circuit 312. The image sensor 300 further includes a first column readout circuit 320 and a second column readout circuit 330. The first pixel circuit 311 and the second pixel circuit 312 may respectively correspond to two adjacent pixels in the pixel array 310A.

In the embodiment, the first pixel circuit 311 includes a first pixel unit PD_p, a first transfer transistor Mtx_p, a first reset transistor Mrst_p, a first readout transistor Msf p, and a first capacitor Cp_p. The second pixel circuit 312 includes a second pixel unit PD_n, a second transfer transistor Mtx_n, a second reset transistor Mrst_n, a second readout transistor Msf n, and a second capacitor Cp_n. The first column readout circuit 320 includes a first circuit node sfd_p, a second circuit node sfd_n, a first transistor M1, a second transistor M2, a third transistor M3 and a fourth transistor M4. The second column readout circuit 330 includes a bias transistor Mb.

In the embodiment, the first pixel unit PD_p and the second pixel unit PD_n may be photodiodes. The first transfer transistor Mtx_p, the first reset transistor Mrst_p, the first readout transistor Msf p, the second transfer transistor Mtx_p, the second reset transistor Mrst_p, the second readout transistor Msf p, the second transistor M2, the fourth transistor M4 and the bias transistor Mb may be N-type transistors respectively. The first transistor M1 and the third transistor M3 may be P-type transistors.

In the embodiment, a first terminal of the first transfer transistor Mtx_p is coupled to a first floating diffusion node FD_node_p. A second terminal of the first transfer transistor Mtx_p is coupled to a first terminal of the first pixel unit PD_p (such as a cathode of a photodiode) through a first sampling node PD_node_p. A control terminal of the first transfer transistor Mtx_p receives a transfer signal TX. A second terminal of the first pixel unit PD_p (for example, an anode of the photodiode) is coupled to the second operating voltage VSS. A first terminal of the first reset transistor Mrst_p is coupled to the first circuit node sfd_p of the first column readout circuit 120. The first circuit node sfd_p is coupled to a first output node out_node_p. A second terminal of the first reset transistor Mrst_p is coupled to the first floating diffusion node FD_node_p. A control terminal of the first reset transistor Mrst_p receives a reset signal RST. A first terminal of the first readout transistor Msf p is coupled to a first circuit node sfd_p of the first column readout circuit 120. A second terminal of the first readout transistor Msf p is coupled to a first terminal of the bias transistor Mb of the second column readout circuit 130. A control terminal of the first readout transistor Msf p is coupled to the first floating diffusion node FD_node_p. The first capacitor Cp_p is coupled between a first ramp signal Vramp_up and the first floating diffusion node FD_node_p. A first terminal of the first capacitor Cp_p receives the first ramp signal Vramp_up. A second terminal of the first capacitor Cp_p is coupled to the first floating diffusion node FD_node_p. In the embodiment, the first ramp signal Vramp_up is an up-ramp signal.

In the embodiment, a first terminal of the second transfer transistor Mtx_n is coupled to a second floating diffusion node FD_node_n. A second terminal of the second transfer transistor Mtx_n is coupled to a first terminal of the second pixel unit PD_n (such as a cathode of a photodiode) through a second sampling node PD_node_n. A control terminal of the second transfer transistor Mtx_n receives the transfer signal TX. A second terminal of the second pixel unit PD_n (for example, an anode of the photodiode) is coupled to the second operating voltage VSS. A first terminal of the second reset transistor Mrst_n is coupled to the second circuit node sfd_n of the first column readout circuit 120. The second circuit node sfd_n is coupled to a second output node out_node_n. A second terminal of the second reset transistor Mrst_n is coupled to the second floating diffusion node FD_node_n. A control terminal of the second reset transistor Mrst_n receives the reset signal RST. A first terminal of the second readout transistor Msf n is coupled to the second circuit node sfd_n of the first column readout circuit 120. A second terminal of the second readout transistor Msf n is coupled to the first terminal of the bias transistor Mb of the second column readout circuit 130. A control terminal of the second readout transistor Msf n is coupled to the second floating diffusion node FD_node_n. The second capacitor Cp_n is coupled between a second ramp signal Vramp_down and the second floating diffusion node FD_node_n. A first terminal of the second capacitor Cp_n receives the second ramp signal Vramp_down. A second terminal of the second capacitor Cp_n is coupled to the second floating diffusion node FD_node_n. In the embodiment, the second ramp signal Vramp_down is a down-ramp signal.

In the embodiment, a first terminal of the first transistor M1 is coupled to the first operating voltage VDD. A second terminal of the first transistor M1 is coupled to the first circuit node sfd_p. A control terminal of the first transistor M1 is coupled to a control voltage Vbp1. A first terminal of the second transistor M2 is coupled to the first circuit node sfd_p. A second terminal of the second transistor M2 is coupled to the second operating voltage VSS. A control terminal of the second transistor M2 receives the pull-down control signal PL. In the embodiment, a first terminal of the third transistor M3 is coupled to the first operating voltage VDD. A second terminal of the third transistor M3 is coupled to the second circuit node sfd_n. A control terminal of the third transistor M3 is coupled to the control voltage Vbp1. A first terminal of the fourth transistor M4 is coupled to the second circuit node sfd_n. A second terminal of the fourth transistor M4 is coupled to the second operating voltage VSS. A control terminal of the fourth transistor M4 receives the pull-down control signal PL. In the embodiment, a second terminal of the bias transistor Mb is coupled to the second operating voltage VSS. A control terminal of the bias transistor Mb receives the bias signal BIAS.

In the embodiment, the first circuit node sfd_p and the second circuit node sfd_n may selectively apply a bias voltage and a reset voltage to the first readout transistor Msf p, the second readout transistor Msf n, the first reset transistor Mrst_p, and the second reset transistor Mrst_n according to a change of the pull-down control signal PL.

In the embodiment, the first column readout circuit 320 may provide a reset voltage to the first floating diffusion node FD_node_p and the second floating diffusion node FD_node_n through the first circuit node sfd_p and the second circuit node sfd_n according to the pull-down control signal PL and the control voltage Vbp1 to reset the voltages of the first floating diffusion node FD_node_p and the second floating diffusion node FD_node_n. Moreover, the first column readout circuit 320 may also provide a bias voltage to the first terminals of the first readout transistor Msf p and the second readout transistor Msf p through the first circuit node sfd_p and the second circuit node sfd_n according to the pull-down control signal PL and the control voltage Vbp1, so that the first readout transistor Msf p and the second readout transistor Msf n may respectively operate as a source follower, so as to read the voltages of the first floating diffusion node FD_node_p and the second floating diffusion node FD_node_n from the first output node out_node_p and the second output node out_node_n. The voltages respectively provided by the first circuit node sfd_p and the second circuit node sfd_n are determined by the pull-down control signal PL and the control voltage Vbp1.

In the embodiment, since the bias voltage and the reset voltage required by the pixel circuit 310 are all provided by the first circuit node sfd_p and the second circuit node sfd_n, the bias voltage and the reset voltage required by the pixel circuit 310 may be obtained through the column readout circuit 320 through a same wiring. Moreover, the pixel circuit 310 may not be provided with a selection transistor and a selection signal line. In other words, the pixel array of the image sensor 300 may effectively save a plurality of metal wires (for example, respectively used for providing reset voltages and selection signals for multiple columns or rows of pixel circuits) in a vertical direction or a horizontal direction in the active area and the selection transistor. In this way, the image sensor 300 of the embodiment may have a higher fill factor and may have a good Gb/Gr balance effect.

Figure 4:
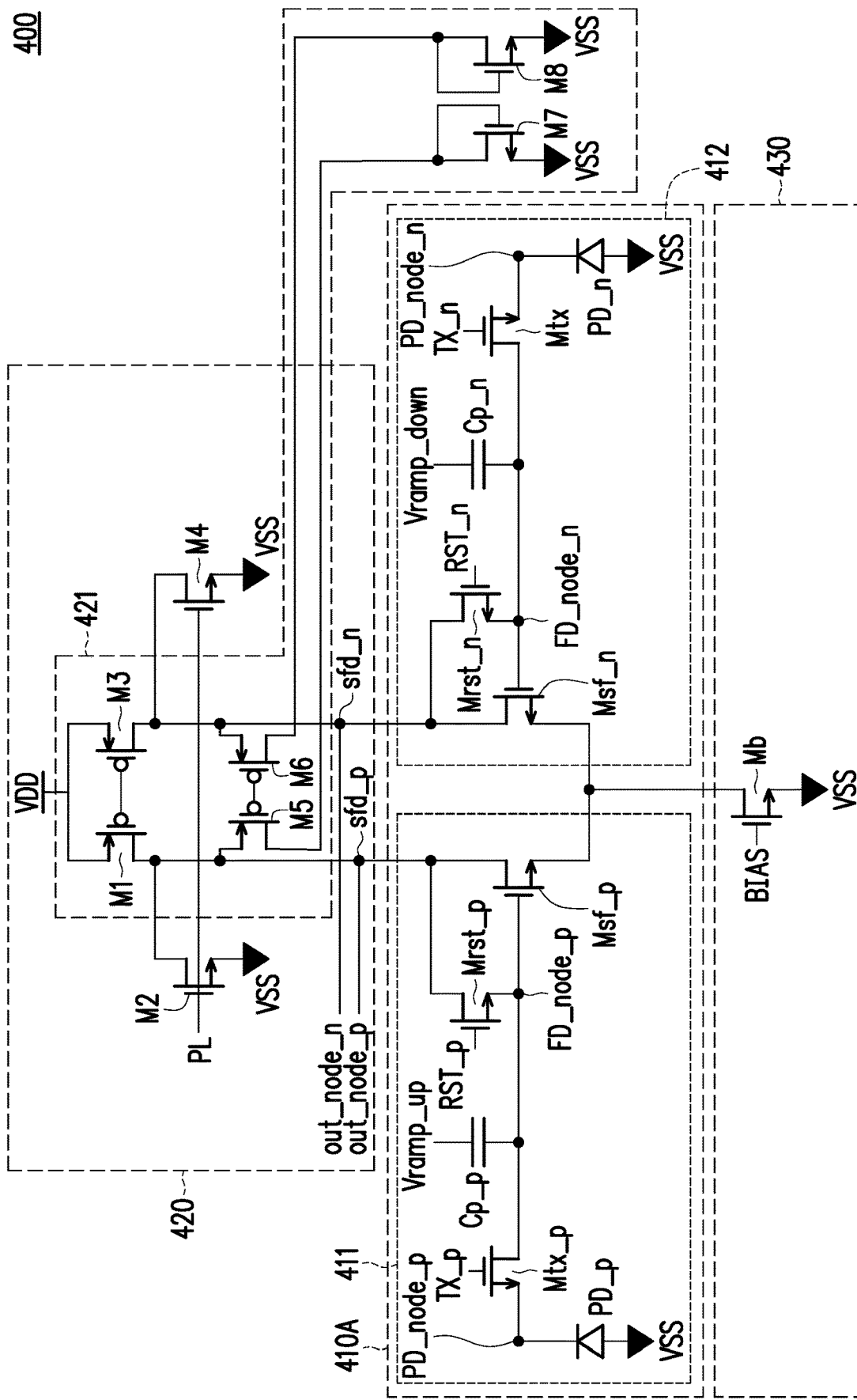
FIG. 4 is a schematic circuit diagram of an image sensor according to another embodiment of the disclosure.

FIG. 4 is a schematic circuit diagram of an image sensor according to another embodiment of the disclosure. Referring to FIG. 4, an image sensor 400 may be implemented as correlated double sampling (CDS) circuit or a double correlated double sampling (DDS) circuit, and may form a folded type operational amplifier, but the disclosure is not limited thereto. In an embodiment, the image sensor 400 may also form a cascode, non-cascode active load or passive load folded type operational amplifier. In the embodiment, a pixel array 410A of the image sensor 400 includes a first pixel circuit 411 and a second pixel circuit 412. The image sensor 400 further includes a first column readout circuit 420 and a second column readout circuit 430. The first pixel circuit 411 and the second pixel circuit 412 may respectively correspond to two adjacent pixels in the pixel array 410A.

In the embodiment, the first pixel circuit 411 includes a first pixel unit PD_p, a first transfer transistor Mtx_p, a first reset transistor Mrst_p, a first readout transistor Msf p, a first capacitor Cp_p, a first floating diffusion node FD_node_p and a first sampling node PD_node_p. The second pixel circuit 412 includes a second pixel unit PD_n, a second transfer transistor Mtx_n, a second reset transistor Mrst_n, a second readout transistor Msf n, a second capacitor Cp_n, a second floating diffusion node FD_node_n, and a second sampling node PD_node_n. The first column readout circuit 420 includes a first circuit node sfd_p, a second circuit node sfd_n, a first transistor M1, a second transistor M2, a third transistor M3, a fourth transistor M4, a fifth transistor M5 and a sixth transistor M6. The second column readout circuit 430 includes a bias transistor Mb. It should be noted that in the embodiment, configurations and implementations of the first pixel circuit 411, the second pixel circuit 412, and the second column readout circuit 430 may be the same as that of the first pixel circuit 311, the second pixel circuit 312 and the second column readout circuit 330 shown in FIG. 3.

It should be noted that a difference between the embodiment of FIG. 4 and FIG. 3 is that an internal circuit of the first pixel circuit 411 may form an operational amplifier 421. In the embodiment, the first transistor M1, the third transistor M3, the fifth transistor M5, the sixth transistor M6, the seventh transistor M7 and the eighth transistor M8 form the operational amplifier 421. In the embodiment, the fifth transistor M5 and the sixth transistor M6 can be P-type transistors. The seventh transistor M7 and the eighth transistor M8 can be N-type transistors.

In the embodiment, a first terminal of the first transistor M1 is coupled to the first operating voltage VDD. A second terminal of the first transistor M1 is coupled to the first circuit node sfd_p. A control terminal of the first transistor M1 is coupled to the control voltage Vbp1. A first terminal of the second transistor M2 is coupled to the first circuit node sfd_p. A second terminal of the second transistor M2 is coupled to the second operating voltage VSS. A control terminal of the second transistor M2 receives the pull-down control signal PL. In the embodiment, a first terminal of the third transistor M3 is coupled to the first operating voltage VDD. A second terminal of the third transistor M3 is coupled to the second circuit node sfd_n. A control terminal of the third transistor M3 is coupled to the control voltage Vbp1. A first terminal of the fourth transistor M4 is coupled to the second circuit node sfd_n. A second terminal of the fourth transistor M4 is coupled to the second operating voltage VSS. A control terminal of the fourth transistor M4 receives the pull-down control signal PL. A first terminal of the fifth transistor M5 is coupled to the second terminal of the first transistor M1. A second terminal of the fifth transistor M5 is coupled to a first terminal of the seventh transistor M7. A control terminal of the fifth transistor M5 is coupled to a control terminal of the sixth transistor M6 and coupled to a control voltage Vbp2. A first terminal of the sixth transistor M6 is coupled to the second terminal of the third transistor M3. A second terminal of the sixth transistor M6 is coupled to a first terminal of the eighth transistor M8. A control terminal of the seventh transistor M7 is coupled to the first terminal of the seventh transistor M7. A second terminal of the seventh transistor M7 is coupled to the second operating voltage VSS. A control terminal of the eighth transistor M8 is coupled to the first terminal of the eighth transistor M8. A second terminal of the eighth transistor M8 is coupled to the second operating voltage VSS.

Figure 5:
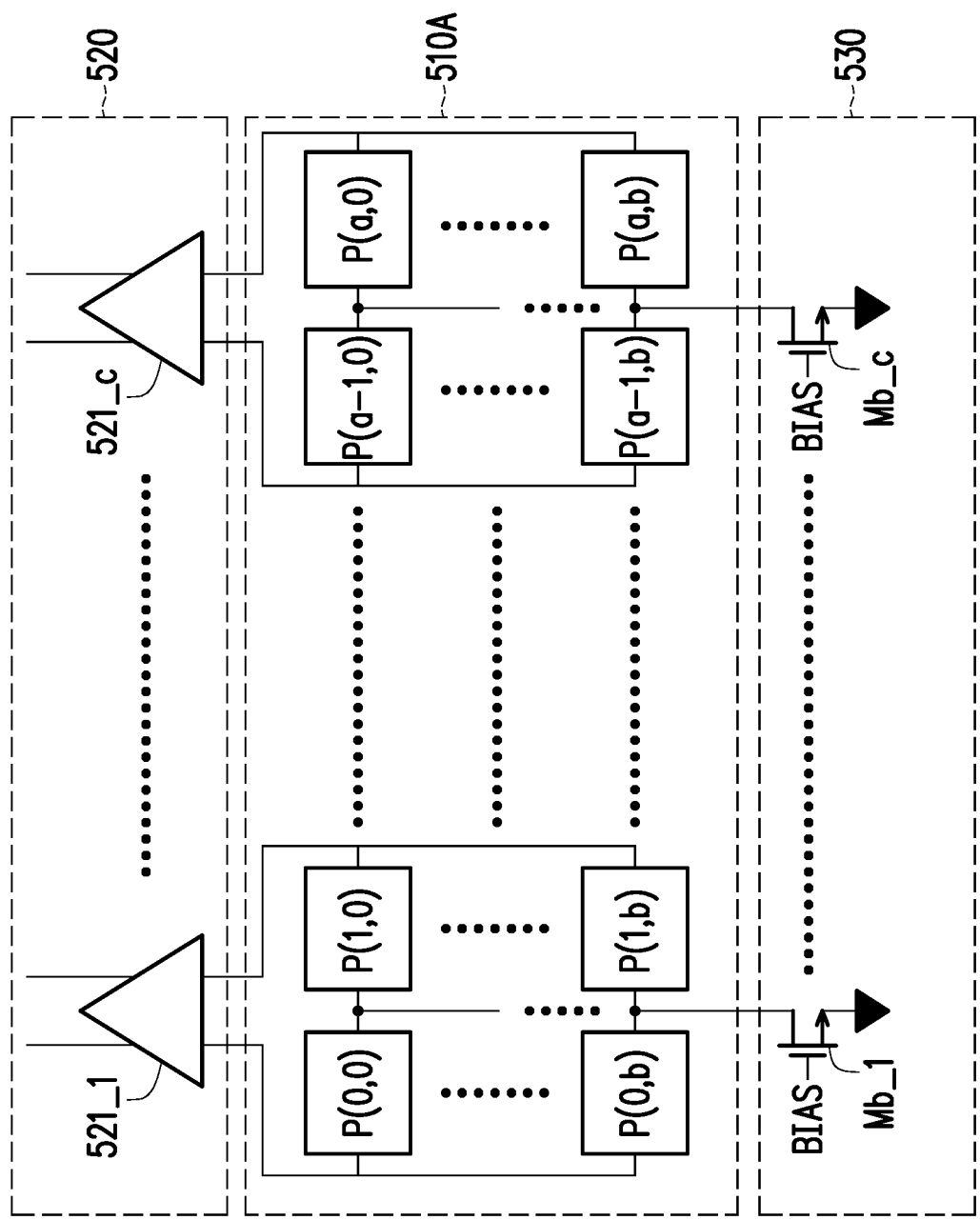
FIG. 5 is a schematic circuit diagram of an image sensor according to another embodiment of the disclosure.

FIG. 5 is a schematic circuit diagram of an image sensor according to another embodiment of the disclosure. Referring to FIG. 5, a pixel array 510A of an image sensor 500 includes a plurality of pixel circuits P(0,0)-P(a,b), where a and b are positive integers. The image sensor 500 further includes a first column readout circuit 520 and a second column readout circuit 530. As shown in FIG. 5, every two adjacent pixel circuits in the pixel circuits P(0,0)-P(a,b) may be implemented as the first pixel circuit 311 or 411 and the second pixel circuit 312 or 412 shown in FIG. 3 or FIG. 4. For example, a first column of the pixel array 510A may include a plurality of first pixel circuits (i.e., pixel circuits P(0,0)-P(0,b)), and a second column of the pixel array 510A may include a plurality of second pixel circuits (i.e., pixel circuits P(1,0)-P(1,b)). Moreover, the first pixel circuits (i.e., the pixel circuits P(0,0)-P(0,b)) and the second pixel circuits (i.e., the pixel circuits P(1,0)-P(1,b)) are coupled connected to a bias transistor Mb_1, and the first pixel circuits and the second pixel circuits are coupled to an operational amplifier 521_1. Other circuit coupling methods of the pixel circuits P(0,0)-P(a,b) may be deduced by analogy. In the embodiment, the first column readout circuit 520 includes a plurality of operational amplifiers 521_1-521_c, where c is a positive integer. The operational amplifiers 521_1-521_c may be respectively implemented as the operational amplifier 421 in FIG. 4, and are respectively used to read out corresponding two adjacent pixel circuits of the pixel circuits P(0,0)-P(a,b). The second column readout circuit 530 includes a plurality of bias transistors Mb_1-Mb_c. The bias transistors Mb_1-Mb_c may be respectively implemented as the bias transistor Mb as shown in FIG. 3 or FIG. 4.

Figure 6:
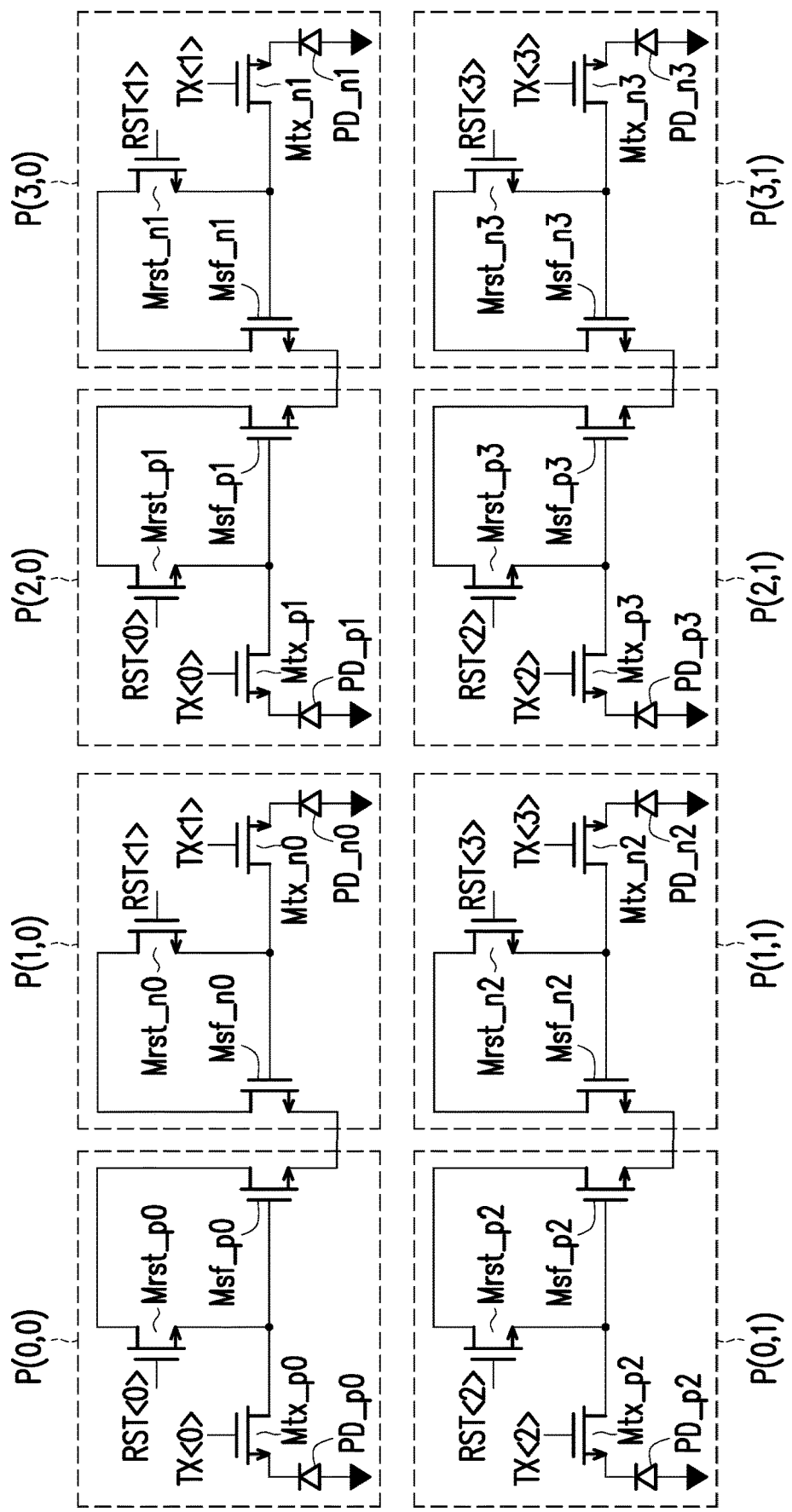
FIG. 6 is a schematic circuit diagram of a plurality of pixel circuits according to an embodiment of the disclosure.
Figure 7:
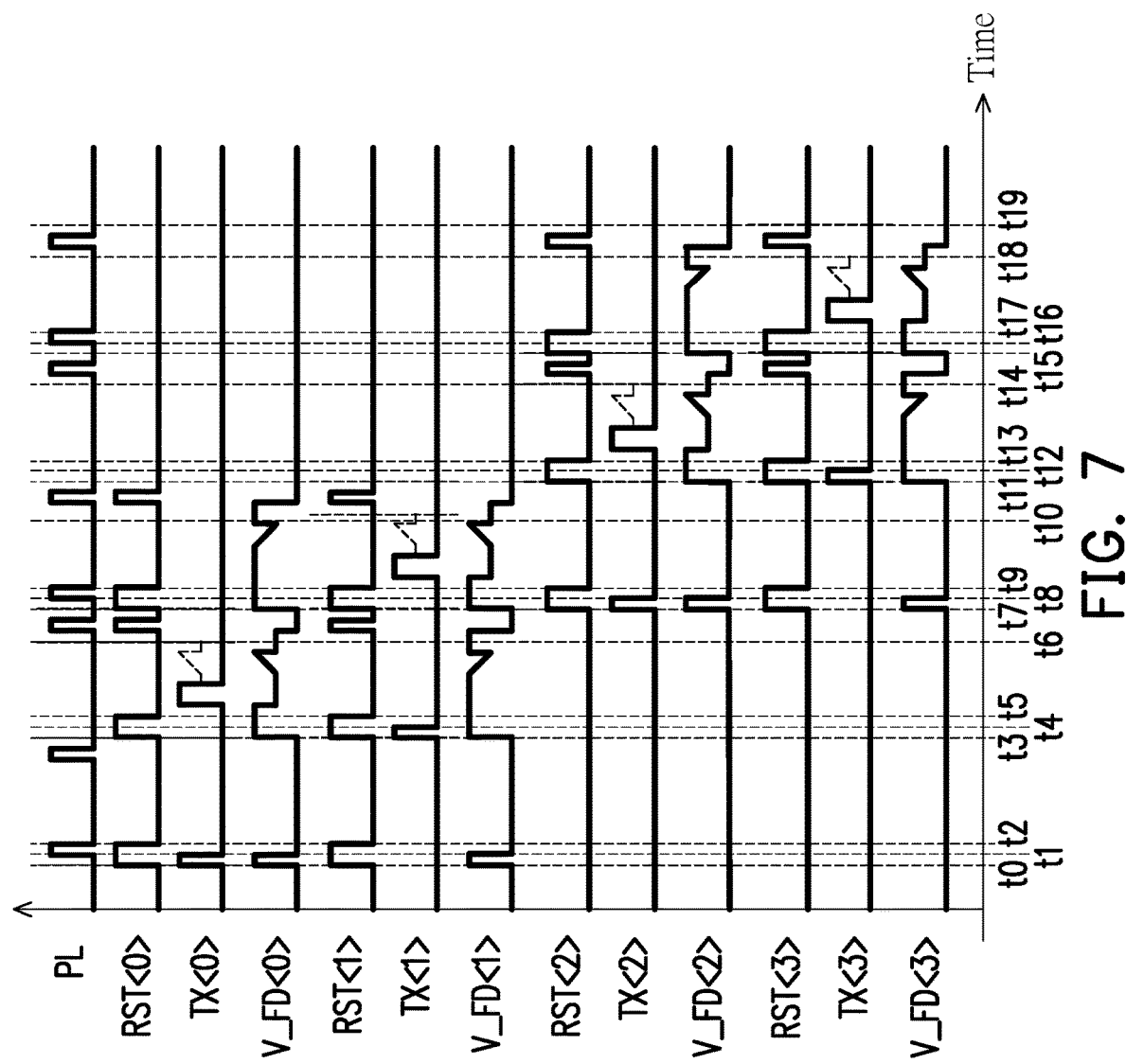
FIG. 7 is a schematic diagram of waveforms of a plurality of signals in the embodiment of FIG. 6.

FIG. 6 is a schematic circuit diagram of a plurality of pixel circuits according to an embodiment of the disclosure. FIG. 7 is a schematic diagram of waveforms of a plurality of signals in the embodiment of FIG. 6. Referring to FIG. 6, taking the pixel circuit P(0,0), the pixel circuit P(1,0), the pixel circuit P(2,0), the pixel circuit P(3,0), the pixel circuit P(0,1), the pixel circuit P(1,1), the pixel circuit P(2,1) and the pixel circuit P(3,1) of FIG. 5 as an example, the pixel circuit P(0,0) includes a pixel unit PD_p0, a transfer transistor Mtx_p0, a reset transistor Mrst_p0, and a readout transistor Msf_p0. The pixel circuit P(1,0) includes a pixel unit PD_n0, a transfer transistor Mtx_n0, a reset transistor Mrst_n0, and a readout transistor Msf_n0. The pixel circuit P(2,0) includes a pixel unit PD_p1, a transfer transistor Mtx_p1, a reset transistor Mrst_p1, and a readout transistor Msf_p1. The pixel circuit P(3,0) includes a pixel unit PD_n1, a transfer transistor Mtx_n1, a reset transistor Mrst_n1, and a readout transistor Msf_n1. The pixel circuit P(0,1) includes a pixel unit PD_p2, a transfer transistor Mtx_p2, a reset transistor Mrst_p2, and a readout transistor Msf_p2. The pixel circuit P(1,1) includes a pixel unit PD_n2, a transfer transistor Mtx_n2, a reset transistor Mrst_n2, and a readout transistor Msf_n2. The pixel circuit P(2,1) includes a pixel unit PD_p3, a transfer transistor Mtx_p3, a reset transistor Mrst_p3, and a readout transistor Msf_p3. The pixel circuit P(3,1) includes a pixel unit PD_n3, a transfer transistor Mtx_n3, a reset transistor Mrst_n3, and a readout transistor Msf_n3. It should be noted that the pixel circuit P(0,0), the pixel circuit P(1,0), the pixel circuit P(2,0), the pixel circuit P(3,0), the pixel circuit P(0,1), the pixel circuit P(1,1), the pixel circuit P(2,1), and the pixel circuit P(3,1) may also include other circuit elements (such as transistors and capacitors) described in the above-mentioned embodiments, and are not limited to that shown in FIG. 6. FIG. 6 only shows a result of a simple circuit.

In the embodiment, a first terminal of the transfer transistor Mtx_p0 is coupled to the floating diffusion node. A second terminal of the transfer transistor Mtx_p0 is coupled to a first terminal of the pixel unit PD_p0. A second terminal of the pixel unit PD is coupled to the second operating voltage. A first terminal of the reset transistor Mrst_p0 is coupled to the circuit node (not shown) of the first column readout circuit. A second terminal of the reset transistor Mrst is coupled to the floating diffusion node. A first terminal of the readout transistor Msf_p0 is coupled to the circuit node of the first column readout circuit. A second terminal of the readout transistor Msf_p0 is coupled to the first terminal of the bias transistor of the second column readout circuit (not shown). A control terminal of the readout transistor Msf_p0 is coupled to the floating diffusion node. Moreover, the internal circuit coupling methods of the pixel circuit P(1,0), the pixel circuit P(2,0), the pixel circuit P(3,0), the pixel circuit P(0,1), the pixel circuit P(1,1), the pixel circuit P(2,1) and the pixel circuit P(3,1) may be deduced by analogy, and details thereof are not repeated, which may be obtained with reference of the descriptions of the above-mentioned embodiments.

In the embodiment, control terminals of the reset transistor Mrst_p0 and the reset transistor Mrst_p1 may receive a reset signal RST<0>. Control terminals of the reset transistor Mrst_n0 and the reset transistor Mrst_n1 may receive a reset signal RST<1>. Control terminals of the transfer transistor Mtx_p0 and the transfer transistor Mtx_p1 may receive a transfer signal TX<0>. Control terminals of the transfer transistor Mtx_n0 and the transfer transistor Mtx_n1 may receive a transfer signal TX<1>. Control terminals of the reset transistor Mrst_p2 and the reset transistor Mrst_p3 may receive a reset signal RST<2>. Control terminals of the reset transistor Mrst_n2 and the reset transistor Mrst_n2 may receive a reset signal RST<3>. Control terminals of the transfer transistor Mtx_p2 and the transfer transistor Mtx_p3 may receive a transfer signal TX<2>. Control terminals of the transfer transistor Mtx_n2 and the transfer transistor Mtx_n3 may receive a transfer signal TX<3>.

Referring to FIG. 6 and FIG. 7, it is first explained that the pixel circuit P(0,0), the pixel circuit P(1,0), the pixel circuit P(2,0), and the pixel circuit P(3,0), the pixel circuit P(0,1), the pixel circuit P(1,1), the pixel circuit P(2,1), the pixel circuit P(3,1) may also be coupled to multiple first column readout circuits described in the above-mentioned embodiments, and these first column readout circuits may receive the same pull-down control signal PL.

During a period from a time t0 to a time t2, the reset signal RST<0> and the reset signal RST<1> are switched from the low voltage level to the high voltage level to turn on the reset transistor Mrst_p0, the reset transistor Mrst_p1, the reset transistor Mrst_n0, and the reset transistor Mrst_n1. During a period from the time t0 to a time t1, the pull-down control signal PL is at the low voltage level, and the transfer signal TX<0> is switched from the low voltage level to the high voltage level to turn on the transfer transistor Mtx_p0 and the transfer transistor Mtx_p1. In this way, the voltages of the respective sampling nodes and the voltages V_FD<0> of the floating diffusion nodes of the pixel circuit P(0,0) and the pixel circuit P(2,0) may be reset to the high voltage level first. Then, during a period from the time t1 to the time t2, the pull-down control signal PL is switched from the low voltage level to the high voltage level, and the transfer signal TX<0> is switched to the low voltage level to pull down the voltages V_FD<0> of the respective floating diffusion nodes of the pixel circuit P(0,0) and the pixel circuit P(2,0) to the low voltage level to achieve the effect of turning off the readout transistor Msf.

During a period from a time t3 to a time t5, the reset signal RST<0> and the reset signal RST<1> are switched from the low voltage level to the high voltage level to turn on the reset transistor Mrst_p0, the reset transistor Mrst_p1, the reset transistor Mrst_n0, and the reset transistor Mrst_n1. During the period from time the t3 to the time t5, the transfer signal TX<1> is at the low voltage level. In this way, the voltages V_FD<0> of the respective floating diffusion nodes of the pixel circuit P(0,0) and the pixel circuit P(2,0) may be reset to the high voltage level. During a period from the time t3 to a time t4, the pull-down control signal PL is at the low voltage level, and the transfer signal TX<1> is switched from the low voltage level to the high voltage level to turn on the transfer transistor Mtx_n0 and the transfer transistor Mtx_n1. In this way, the voltages of the respective sampling nodes and the voltages V_FD<1> of the floating diffusion nodes of the pixel circuit P(1,0) and the pixel circuit P(3,0) may be reset to the high voltage level.

During a period from a time t5 to a time t6, the transfer signal TX<0> is switched to the high voltage level, and the pixel circuit P(0,0) and the pixel circuit P(2,0) may read out sensing results of the pixel unit PD_p0 and the pixel unit PD_p1 according to a ramp signal having an up-ramp waveform. During a period from the time t6 to a time t7, the pull-down control signal PL, the reset signal RST<0> and the reset signal RST<1> are switched from the low voltage level to the high voltage level to temporarily turn off the readout transistor Msf_p2, the transfer transistor Msf_p3, the transfer transistor Msf_n2, and the transfer transistor Msf_n3 respectively serving as source followers.

During a period from time the t7 to a time t9, the reset signal RST<0> and the reset signal RST<1> are switched from the low voltage level to the high voltage level to turn on the reset transistor Mrst_p0, the reset transistor Mrst_p1, the reset transistor Mrst_n0, and the reset transistor Mrst_n1. During the period from the time t7 to the time t9, the transfer signal TX<0> and the transfer signal TX<1> are respectively at the low voltage level. In this way, the voltages V_FD<0> and the voltages V_FD<1> of the respective floating diffusion nodes of the pixel circuit P(0,0), the pixel circuit P(1,0), the pixel circuit P(2,0) and the pixel circuit P(3,0) may be reset to the high voltage level.

During a period from the time t9 to a time t10, the transfer signal TX<1> is switched to the high voltage level, and the pixel circuit P(1,0) and the pixel circuit P(3,0) may read out other sensing results of the pixel unit PD_n0 and the pixel unit PD_n1 according to the ramp signal having the up-ramp waveform. During a period from the time t10 to a time t11, the pull-down control signal PL, the reset signal RST<0> and the reset signal RST<1> are switched from the low voltage level to the high voltage level to turn off the transfer transistor Mtx_p0, the transfer transistor Mtx_p1, the transfer transistor Mtx_n0 and the transfer transistor Mtx_n1 respectively serving as source followers. In this way, the first column readout circuit may generate a differential output through the operational amplifier according to the sensing results of the pixel unit PD_n0 and the pixel unit PD_n1 respectively, and may then generate another differential output through the operational amplifier according to the other sensing results of the pixel unit PD_n0 and the pixel unit PD_n1 respectively.

During the period from the time t7 to the time t9, the reset signal RST<2> and the reset signal RST<3> are switched from the low voltage level to the high voltage level to turn on the reset transistor Mrst_p2, the reset transistor Mrst_p3, the reset transistor Mrst_n2, and the reset transistor Mrst_n3. During the period from the time t7 to a time t8, the pull-down control signal PL is at the low voltage level, and the transfer signal TX<2> is switched from the low voltage level to the high voltage level to turn on the transfer transistor Mtx_p2 and the transfer transistor Mtx_p3. In this way, the voltages of the respective sampling nodes and the voltages V_FD<2> of the floating diffusion nodes of the pixel circuit P(0,1) and the pixel circuit P(2,1) may be reset to the high voltage level first. Then, during the period from the time t8 to the time t9, the pull-down control signal PL is switched from the low voltage level to the high voltage level, and the transfer signal TX<2> is switched to the low voltage level to pull down the voltages V_FD<2> of the respective floating diffusion nodes of the pixel circuit P(0,1) and the pixel circuit P(2,1) to the low voltage level. During the period from the time t10 to the time t11, the pull-down control signal PL may be switched from the low voltage level to the high voltage level first, and then switched back to the low voltage level.

During a period from time the t11 to time a t13, the reset signal RST<2> and the reset signal RST<3> are switched from the low voltage level to the high voltage level to turn on the reset transistor Mrst_p0, the reset transistor Mrst_p1, the reset transistor Mrst_n0, and the reset transistor Mrst_n1. During the period from time t11 to time t13, the transfer signal TX<2> is at the low voltage level. In this way, the voltages V_FD<2> of the respective floating diffusion nodes of the pixel circuit P(0,1) and the pixel circuit P(2,1) may be reset to the high voltage level. During a period from the time t11 to a time t2, the pull-down control signal PL is at the low voltage level, and the transfer signal TX<4> is switched from the low voltage level to the high voltage level to turn on the transfer transistor Mtx_n2 and the transfer transistor Mtx_n3. In this way, the voltages of the respective sampling nodes and the voltages V_FD<3> of the floating diffusion nodes of the pixel circuit P(1,1) and the pixel circuit P(3,1) may be reset to the high voltage level.

During a period from the time t13 to a time t14, the transfer signal TX<2> is switched to the high voltage level, and the pixel circuit P(0,1) and the pixel circuit P(2,1) may read out sensing results of the pixel unit PD_p2 and the pixel unit PD_p3 according to the ramp signal having the up-ramp waveform. During a period from the time t14 to a time t15, the pull-down control signal PL, the reset signal RST<2> and the reset signal RST<3> are switched from the low voltage level to the high voltage level to temporarily turn off the readout transistor Msf_p2, the transfer transistor Msf_p3, the transfer transistor Msf_n2, and the transfer transistor Msf_n3 serving as source followers.

During a period from a time t15 to a time t17, the reset signal RST<2> and the reset signal RST<3> are switched from the low voltage level to the high voltage level to turn on the reset transistor Mrst_p2, the reset transistor Mrst_p3, the reset transistor Mrst_n2, and the reset transistor Mrst_n3. During the period from the time t15 to the time t17, the transfer signal TX<0> and the transfer signal TX<1> are respectively at the low voltage level. In this way, the voltages V_FD<2> and the voltages V_FD<3> of the respective floating diffusion nodes of the pixel circuit P(0,1), the pixel circuit P(1,1), the pixel circuit P(2,1) and the pixel circuit P(3,1) may be reset to the high voltage level.

During a period from the time t17 to a time t18, the transfer signal TX<3> is switched to the high voltage level, and the pixel circuit P(1,1) and the pixel circuit P(3,1) may read out other sensing results of the pixel unit PD_n2 and the pixel unit PD_n3 according to the ramp signal having the up-ramp waveform. During a period from the time t18 to a time t19, the pull-down control signal PL, the reset signal RST<0> and the reset signal RST<1> are switched from the low voltage level to the high voltage level to turn off the readout transistor Msf_p2, the transfer transistor Msf_p3, the transfer transistor Msf_n2, and the transfer transistor Msf_n3 respectively serving as source followers. In this way, the first column readout circuit may generate a differential output through the operational amplifier according to the sensing results of the pixel unit PD_n2 and the pixel unit PD_n3 respectively, and may then generate another differential output through the operational amplifier according to the other sensing results of the pixel unit PD_n2 and the pixel unit PD_n3 respectively.

Figure 8:
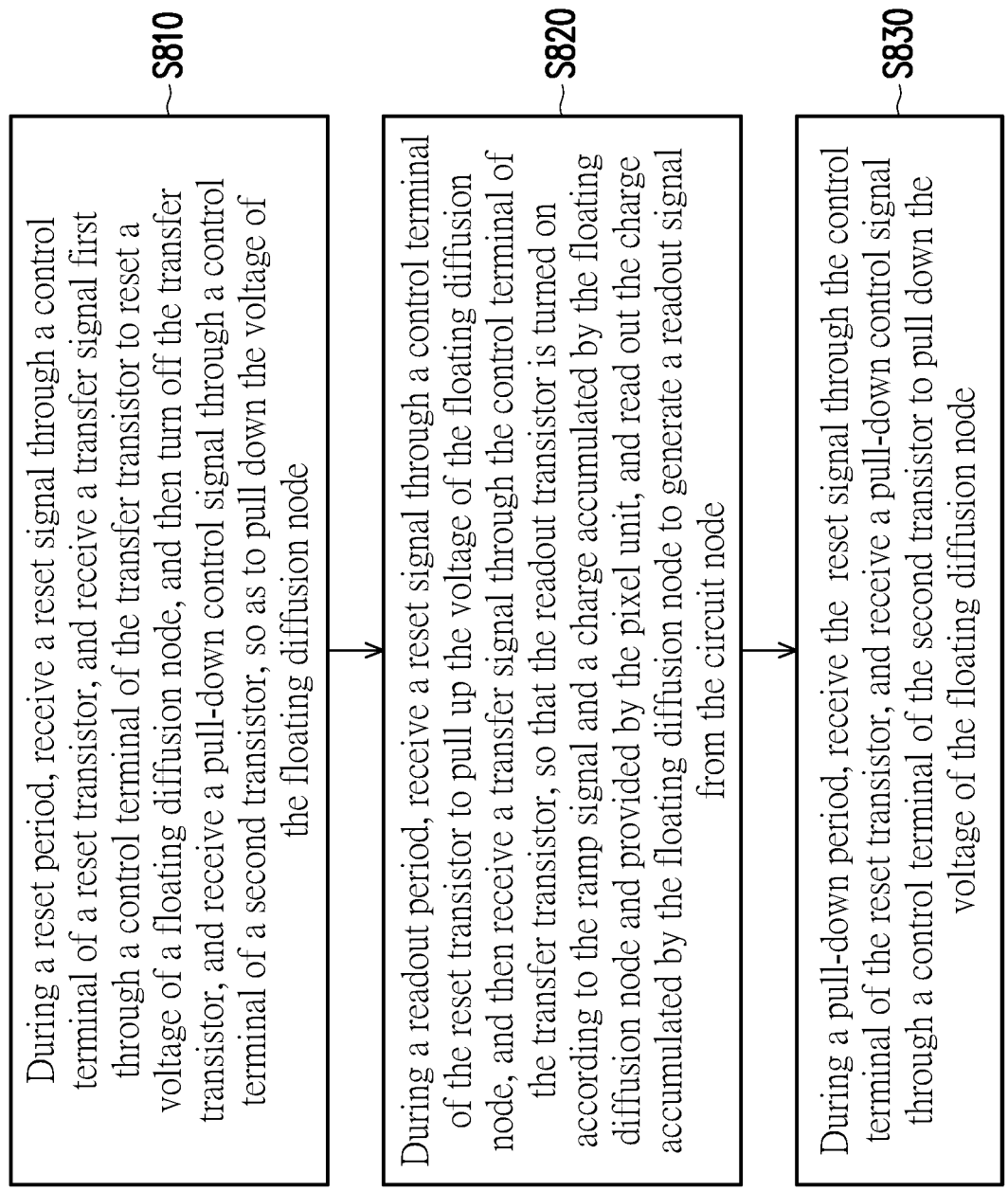
FIG. 8 is a flowchart of an operation method according to an embodiment of the disclosure.

FIG. 8 is a flowchart of an operation method according to an embodiment of the disclosure. Referring to FIG. 1, FIG. 2 and FIG. 8, in the embodiment, the image sensor 100 may be operated according to following steps S810-S830. In step S810, during the reset period RP1 from the time t0 to the time t3, the control terminal of the reset transistor Mrst receives the reset signal RST, and the control terminal of the transfer transistor Mtx first receives the transfer signal TX to reset the voltage V_FD of the floating diffusion node FD_node, and then turns off the transfer transistor Mtx, and the control terminal of the second transistor M2 simultaneously receives the pull-down control signal PL to pull down the voltage V_FD of the floating diffusion node FD_node. In step S820, during the readout period RP2 from the time t3 to the time t6, the control terminal of the transfer transistor Mtx receives the transfer signal TX, so that the readout transistor Msf is turned on according to the ramp signal Vramp and the charge accumulated by the floating diffusion node FD_node and provided by the pixel unit PD, and reads out the charge accumulated by the floating diffusion node FD_node to generate a readout signal from the circuit node sfd. In step S830, during the pull-down period PLP from the time t9 to the time t11, the control terminal of the reset transistor Mrst receives the reset signal RST, and the control terminal of the second transistor M2 receives the pull-down control signal PL to pull down the voltage V_FD of the floating diffusion node FD_node. Therefore, the operation method of the embodiment allows the image sensor 100 to obtain the bias voltage and the reset voltage required by the pixel circuit 110 through the circuit node sfd of the first column readout circuit 120 through the same wiring.

In summary, in the image sensor and the operation method thereof of the disclosure, a circuit node of the column readout circuit may be used to provide the bias voltage and reset voltage required by the pixel circuit, and may implement the function of pixel selection, so as to effectively reduce the number of multiple metal lines (for example, respectively used to provide reset voltages and selection signals for multiple columns or rows of pixel circuits) in the vertical direction or horizontal direction in the active area, and each pixel does not need to be set with selection transistor. In this way, the image sensor and the operation method thereof of the disclosure may realize the image sensor with a higher fill factor and can have a good Gb/Gr balance effect. Moreover, since the image sensor of the disclosure may have a higher fill factor, a problem of lens shading fall-off may also be effectively mitigated, and the image sensor of the disclosure may also have better sensing sensitivity. Even, since the image sensor of the disclosure has better sensing sensitivity, the image sensor of the disclosure may achieve better low light signal-to-noise ratio (SNR).

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An image sensor, comprising:
    a first pixel circuit, comprising:
    a first pixel unit;
    a first transfer transistor, wherein a first terminal of the first transfer transistor is coupled to a first floating diffusion node, and a second terminal of the first transfer transistor is coupled to the first pixel unit;
    a first reset transistor, coupled to the first floating diffusion node;
    a first readout transistor, wherein a control terminal of the first readout transistor is coupled to the first floating diffusion node; and
    a first capacitor, coupled between a ramp signal and the floating diffusion node;
    a first column readout circuit, comprising a first circuit node; and
    a second column readout circuit, comprising a bias transistor,
    wherein a first terminal of the first reset transistor and a first terminal of the first readout transistor are coupled to the first circuit node, and a second terminal of the first readout transistor is coupled to the bias transistor.

2. The image sensor according to claim 1, wherein a first terminal of the readout transistor is coupled to the first circuit node, and the first terminal of the readout transistor is a drain terminal.

3. The image sensor according to claim 1, wherein the ramp signal is an up-ramp signal or a down-ramp signal.

4. The image sensor according to claim 1, wherein the transfer transistor, the reset transistor, the readout transistor, and the selection transistor are respectively N-type transistors.

5. The image sensor according to claim 1, wherein the column readout circuit further comprises:
    a first transistor, wherein a first terminal of the first transistor is coupled to a first operating voltage, and a second terminal of the first transistor is coupled to the first circuit node and a first output terminal; and a second transistor, wherein a first terminal of the second transistor is coupled to the first circuit node and the first output terminal, and a second terminal of the second transistor is coupled to a second operating voltage.

6. The image sensor according to claim 5, further comprising:
a second pixel circuit, comprising:
a second pixel unit;
a second transfer transistor, wherein a first terminal of the second transfer transistor is coupled to a second floating diffusion node, and a second terminal of the second transfer transistor is coupled to the second pixel unit;
a second reset transistor, coupled to the second floating diffusion node; and
a second readout transistor, wherein a control terminal of the second readout transistor is coupled to the second floating diffusion node,
wherein the first column readout circuit further comprises a second circuit node,
wherein a first terminal of the second reset transistor and a first terminal of the second readout transistor are coupled to the second circuit node, and a second terminal of the second readout transistor is coupled to the bias transistor.

7. The image sensor according to claim 6, wherein the column readout circuit further comprises:
a third transistor, wherein a first terminal of the third transistor is coupled to the first operating voltage, and the second terminal of the first transistor is coupled to the second circuit node and a second output terminal; and
a fourth transistor, wherein a first terminal of the fourth transistor is coupled to the second circuit node and the second output terminal, and a second terminal of the fourth transistor is coupled to the second operating voltage.

8. The image sensor according to claim 7, wherein a control terminal of the first transistor is coupled to a control terminal of the third transistor, and a control terminal of the second transistor and a control terminal of the fourth transistor are coupled to a pull-down control signal.

9. The image sensor according to claim 7, wherein the first transistor and the third transistor are respectively P-type transistors, and the second transistor and the fourth transistor are respectively N-type transistors.

10. The image sensor according to claim 7, wherein the column readout circuit further comprises:
a fifth transistor, wherein a first terminal of the fifth transistor is coupled to the second terminal of the first transistor; and
a sixth transistor, wherein a first terminal of the sixth transistor is coupled to a second terminal of the third transistor;
wherein a control terminal of the fifth transistor is coupled to a control terminal of the sixth transistor.

11. The image sensor according to claim 10, wherein a second terminal of the fifth transistor is coupled to a first terminal of a seventh transistor, and a second terminal of the sixth transistor is coupled to a first terminal of an eighth transistor,
wherein a control terminal of the seventh transistor is coupled to the first terminal of the seventh transistor, and a control terminal of the eighth transistor is coupled to the first terminal of the eighth transistor.

12. The image sensor according to claim 11, wherein the fifth transistor and the sixth transistor are respectively P-type transistors, and the seventh transistor and the eighth transistor are respectively N-type transistors.

13. The image sensor according to claim 11, wherein the first transistor, the second transistor, the third transistor, the fourth transistor, the fifth transistor, the sixth transistor, the seventh transistor, and the eighth transistor form an operational amplifier.

14. The image sensor according to claim 12, further comprising a pixel array, wherein a first column of the pixel array comprises a plurality of first pixel circuits, and a second column of the pixel array comprises a plurality of second pixel circuits,
wherein the first pixel circuits and the second pixel circuits are coupled to the bias transistor, and the first pixel circuits and the second pixel circuits are coupled to the operational amplifier.

15. The image sensor according to claim 5, wherein during a reset period, a control terminal of the first reset transistor receives a first reset signal, and a control terminal of the transfer transistor first receives a transfer signal to reset the first photodiode voltage, and then turns off the transfer signal, and a control terminal of the second transistor receives a pull-down control signal to pull down the voltage of the first floating diffusion node;
wherein during a readout period, the control terminal of the first reset transistor receives the first reset signal to pull up the voltage of the floating diffusion node, and then the control terminal of the transfer transistor receives a transfer signal, so that the first readout transistor is turned on according to the ramp signal and a charge accumulated by the first floating diffusion node and provided by the first pixel unit, and reads out the charge accumulated by the first floating diffusion node to generate a readout signal from the first circuit node;
wherein during a pull-down period, the control terminal of the first reset transistor receives the first reset signal, and the control terminal of the second transistor receives a pull-down control signal to pull down the voltage of the first floating diffusion node.

16. An operation method of an image sensor, wherein the image sensor comprises a first pixel circuit, a first column readout circuit, and a second column readout circuit, the first pixel circuit comprises a first pixel unit, a first transfer transistor, a first reset transistor, a first readout transistor, and a first capacitor, the first column readout circuit comprises a first circuit node, wherein a first terminal of the first reset transistor and a first terminal of the first readout transistor are coupled to the first circuit node, and a second terminal of the first readout transistor is coupled to the bias transistor, wherein the operation method comprises:
receiving a first reset signal through a control terminal of the first reset transistor during a reset period, and receiving a transfer signal first through a control terminal of the transfer transistor to reset a voltage of a first floating diffusion node, and then receiving a pull-down control signal through a control terminal of a second transistor to pull down the voltage of the first floating diffusion node;
receiving a transfer signal through the control terminal of the transfer transistor during a readout period, so that the first readout transistor is turned on according to the ramp signal and a charge accumulated by the first floating diffusion node and provided by the first pixel unit, and reading out the charge accumulated by the first floating diffusion node to generate a readout signal from the first circuit node; and receiving the first reset signal through the control terminal of the first reset transistor during a pull-down period, and receiving a pull-down control signal through a control terminal of the second transistor to pull down the voltage of the first floating diffusion node.

\* \* \* \* \*